(12) United States Patent
Low et al.

(10) Patent No.: US 6,456,221 B2
(45) Date of Patent: Sep. 24, 2002

(54) METHOD AND APPARATUS FOR SIGNAL DETECTION IN ULTRA WIDE-BAND COMMUNICATIONS

(75) Inventors: Kay Soon Low; Jurianto Joe, both of Singapore (SG)

(73) Assignee: The National University of Singapore, Singapore (SG)

( * ) Notice: Subject to any disclaimer, the term of this patent is extended or adjusted under 35 U.S.C. 154(b) by 0 days.

(21) Appl. No.: 09/847,777

(22) Filed: May 1, 2001

Related U.S. Application Data

(63) Continuation-in-part of application No. 09/429,527, filed on Oct. 28, 1999, now Pat. No. 6,259,390, and a continuation-in-part of application No. 09/805,845, filed on Mar. 13, 2001.

(51) Int. Cl.[7] .................................................. H03M 1/60
(52) U.S. Cl. ........................................ 341/157; 375/239
(58) Field of Search ................................ 341/112, 111, 341/157, 133; 375/239, 295, 316

(56) References Cited

U.S. PATENT DOCUMENTS

| | | | | |
|---|---|---|---|---|
| 3,755,696 A | * | 8/1973 | Nicholson et al. | 327/306 |
| 5,170,274 A | * | 12/1992 | Kuwata et al. | 359/282 |
| 5,337,054 A | * | 8/1994 | Ross et al. | 359/194 |
| 5,764,702 A | | 6/1998 | Caiaffa | 375/316 |
| 5,777,507 A | * | 7/1998 | Kaminishi et al. | 327/514 |
| 5,901,172 A | * | 5/1999 | Fontana et al. | 375/200 |
| 6,060,932 A | * | 5/2000 | Devin | 327/298 |
| 6,275,544 B1 | * | 8/2001 | Aiello et al. | 375/326 |
| 6,292,067 B1 | | 9/2001 | Sasabata et al. | 322/115 |

FOREIGN PATENT DOCUMENTS

| | | | |
|---|---|---|---|
| DE | 94 855 | 1/1973 | ........... G01R/19/26 |
| DE | 2459531 A1 | 7/1976 | |
| DE | 2602794 A1 | 7/1977 | ............ H03K/3/25 |
| DE | 19809334 A1 | 9/1999 | ............ H03M/1/66 |
| FR | 1 438 262 | 7/1966 | ............ H03K/5/00 |
| GB | 1036328 | 7/1966 | |
| JP | 11-074766 | 3/1999 | ............ H03B/5/06 |

* cited by examiner

Primary Examiner—Peguy JeanPierre
(74) Attorney, Agent, or Firm—Townsend and Townsend and Crew LLP; Kenneth R. Allen

(57) ABSTRACT

Methods and apparatus for detecting ultra wide-band signals using circuitry having nonlinear dynamics characteristics are disclosed. The receiver circuit can be implemented using a simple tunnel diode or using an op-amp to provide dynamic characteristics. The detector can be used in a variety of modulation schemes, including but not limited to an ON-OFF keying scheme, an M-ary pulse position modulation scheme, and a pulse width modulation scheme. The approach requires only a single frame to detect the signal.

33 Claims, 6 Drawing Sheets

METHOD AND APPARATUS FOR SIGNAL DETECTION IN ULTRA WIDE-BAND COMMUNICATIONS

CROSS REFERENCE TO RELATED APPLICATION

This application is a continuation-in-part of U.S. application Ser. No. 09/429,527 for METHOD AND APPARATUS FOR GENERATING PULSES FROM ANALOG WAVEFORMS, filed Oct. 28, 1999 now U.S. Pat. No. 6,259,340 and U.S. application Ser. No. 09/805,845 for CIRCUITRY WITH RESISTIVE INPUT IMPEDANCE FOR GENERATING PULSES FROM ANALOG WAVEFORMS, filed Mar. 13, 2001, both of which are owned by the Assignee of the present invention, and are herein incorporated by reference for all purposes.

This application is related to co-pending and co-owned U.S. application Ser. No. 09/429,519 for A METHOD AND APPARATUS FOR COMMUNICATION USING PULSE DECODING, filed Oct. 28, 1999 and to concurrently filed and co-owned U.S. application Ser. No. 09/805,854 for METHOD AND APPARATUS TO RECOVER DATA FROM PULSES, filed Mar. 13, 2001, both of which are owned by the Assignee of the present invention and are herein incorporated by reference for all purposes.

BACKGROUND OF THE INVENTION

This invention relates generally to techniques for generating pulses and more specifically to techniques for converting arbitrary analog waveforms to produce sequences of pulses.

Ultra wide-band (UWB) is a fundamentally different information-transmission approach as compared to today's continuous-wave RF-carrier signal transmissions. The UWB technology originated in the early 1960's arising from studies on characterizing the microwave networks by their impulse response. A variety of names, including "baseband," "impulse," "short-pulse," and "carrier-free," identified the technology until the 1990's, when the Department of Defense of the United States began using the term "ultra wide-band."

In UWB signaling, the transmission uses very short impulses of radio energy. This results in a characteristic spectrum that covers a wide range of radio frequencies. UWB systems have historically utilized impulse, or shock-excited, transmission techniques in which an ultra-short duration pulse (typically tens of picoseconds to a few nanoseconds in duration) is directly applied to an antenna which then radiates its characteristic impulse response. For this reason, UWB systems have often been referred to as "impulse" radar or communications. In addition, since the excitation pulse is not a modulated or filtered waveform, such systems have also been termed "carrier-free" in that no apparent carrier frequency is evident from the resulting RF spectrum. As the UWB signals have high bandwidth and frequency diversity, they are very well suited for various applications such as the wireless high speed data communication, etc. Typical UWB transmission systems include ON-OFF keying (binary amplitude shift keying ASK) and pulse position modulation (PPM).

To receive a signal that is originated from an ultra wide-band transmitter, an apparatus that is capable of triggering on very fast but low energy pulses is required. Two commonly used devices are the tunnel diode and the avalanche transistor. As the tunnel diode has a well defined i-v characteristic and its sensitivity is almost an order of magnitude better than that of the avalanche transistor, it is being used by most practitioners in the art.

In many developments of the ultra wide-band receivers, the tunnel diode has been used to detect the total energy in a pulse. In general, the tunnel diode is biased to operate as a bistable multivibrator as it has a characteristic of changing state whenever the charging carriers exceed a certain threshold.

In 1973, U.S. Pat. No. 3,755,696 introduced a constant false alarm rate (CFAR) circuit based on a tunnel diode detector. The circuit detects the noise dwells and data dwells to dynamically determine the optimum bias level of the tunnel diode that in turn improved the threshold sensitivity.

In 1994, U.S. Pat. No. 5,337,054 has shown a coherent processing method that is based on a tunnel diode detector that aims to improve the CFAR sensitivity. This is achieved by mixing the incoming signal with a continuous wave carrier that results in a beat frequency one-half of a RF (radio frequency) cycle for the given microwave burst. Thus, a monopolar baseband signal is obtained which maximizes the charge available to trigger the tunnel diode.

In 1999, U.S. Pat. No. 5,901,172 described a method that utilizes a microwave tunnel diode as a single pulse detector for the ultra wide-band applications. The optimum biasing point is determined only during the calibration phase at the system start-up. To gain good noise immunity, it uses an adaptive voltage variable attenuator that responds to the sample ambient noise.

Another type of UWB receiver uses the so-called "correlator" concept. Correlator has proven to be the optimum detector for a narrowband communication system. However, it has yet to be shown that this concept is optimum for ultra wide-band communication. In the prior art implementations of this concept, a Pulse Position Modulation (PPM) technique is utilized. Information is sent out frame by frame. Within each frame, a pulse, whose width is much smaller than the time period of a frame, is uniquely positioned to represent a symbol. The correlator based receiver requires hundreds or thousands of these frames to gather enough energy to recover just one symbol.

In prior art solutions that use the tunnel diode as a detector, which operates in a bistable mode, there is a need to discharge the tunnel diode detector after each detection. Consequently, additional circuitry is required, and the speed of detection can be detrimentally limited by the time needed to discharge the tunnel diode.

In prior art solutions where a correlator detector is used to detect the UWB signal, hundreds or even thousands of frames are needed to recover one information symbol. This means the symbol rate will be much less than the rate at which the frames are transmitted.

Therefore, there is a need for a receiver whose symbol rate can be as fast as the rate the pulses are transmitted and not be bounded by any initialization requirement such as discharging a tunnel diode.

SUMMARY OF THE INVENTION

A method and apparatus for detecting a received ultra-wide band (UWB) signal includes receiving a transmitted UWB signal. In one embodiment of the invention, the transmitted UWB signal is an information waveform representative of one or more symbols to be communicated. The received signal is processed to produce a pulse waveform comprising groups of pulses. A detection waveform is applied to the pulse waveform to mask out extraneous pulse groups that do not correspond to the information waveform. A decoder is applied to the remaining groups of pulses to reproduce the original symbols.

A communication system is provided which incorporates the signaling method and apparatus of the present invention.

BRIEF DESCRIPTION OF THE DRAWINGS

The teachings of the present invention can be readily understood by considering the following detailed description in conjunction with the accompanying drawings.

DESCRIPTION OF THE SPECIFIC EMBODIMENTS

In developing a method and apparatus for a communication system, U.S. Pat. No. 6,259,390 reported a controlled relaxation oscillator. In that invention, the circuit generates desired numbers of oscillations followed by a substantially instant cessation of oscillations in response to an input waveform. The controlled relaxation oscillator can be realized in a number of circuit topologies. A further invention is reported in concurrently filed and co-owned U.S. patent application Ser. No. 09/839,810 for METHOD AND APPARATUS FOR GENERATING PULSES USING DYNAMIC TRANSFER FUNCTION CHARACTERISTICS. In this latter invention, an additional control input had been added to the op-amp based circuitry such that the I-V characteristic curve can be translated dynamically.

In accordance with the present application, we use an N-shaped characteristic circuit, which can be implemented using a tunnel diode or an op-amp based circuit configuration. The circuit is part of a receiver for the detection of a transmitted ultra wide-band signal. We reveal a new UWB receiver that controls the operating point of a receiver circuit whose transfer function is characterized by an unstable region bounded by first and second stable regions. The circuit operates in a controlled astable mode.

As will be described, the circuit can be op-amp based or can be implemented using a microwave tunnel diode. The circuit is configured to generate amplified pulses in response to incoming UWB signals by utilizing the negative resistance region of the I-V characteristic of the circuit.

Figure 1:
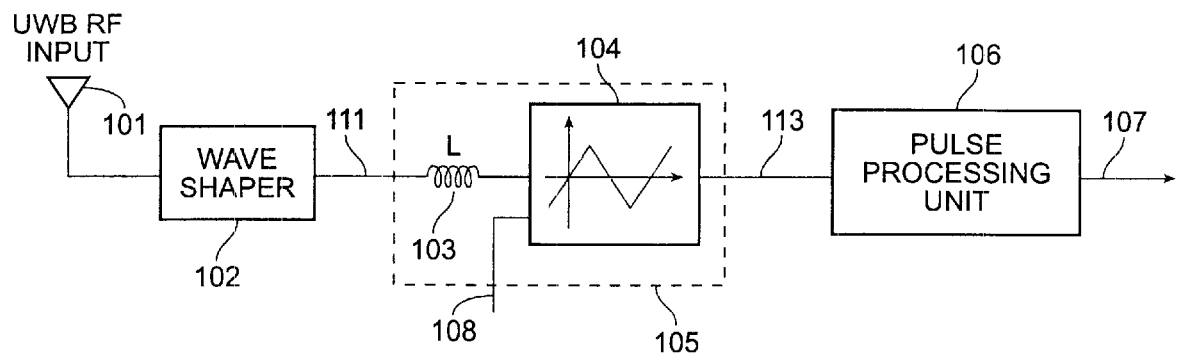
FIG. 1 shows a simplified block diagram of an ultra-wide band receiver system in an illustrative embodiment of the present invention.

FIG. 1 shows a general block diagram of a particular illustrative embodiment of the invention. The system comprises an antenna 101 which receives a transmitted UWB RF signal. The signal may originate as an information waveform of pulses representative of information symbols to be transmitted. As will be discussed in the following illustrative embodiments of the invention, any one of various encoding schemes might be used at a transmitting end of a communication system to represent the information symbols to be transmitted.

The received UWB signal may pass through an optional wave shaper circuit 102 to produce a conditioned signal. The main purpose of the wave shaper circuit is to condition the incoming signal to make it suitable for optimum detection by the subsequent circuit. There are various circuit configurations that may be used. In an illustrative embodiment, for example, the wave shaper circuit might be an integrator or a double integrator where the received signal can then be integrated to produce a suitable waveform.

In another embodiment of the invention, the wave shaper circuit 102 might be an envelope detector to detect specially constructed or modulated signals. For example, a one nanosecond pulse, whose main lobe spectrum occupies a frequency range from DC–1 GHz, can be modulated by a few cycles of a 3 GHz sinusoidal carrier waveform to shift the information occupation of the main lobe spectrum to 2 GHz–4 GHz. An envelope detector can recover the pulse 111 from this specially modulated signal.

In still another embodiment of the invention, the wave shaper might be a hard limiter, to restrict the peak signals to some constrained values. In yet another embodiment, the wave shaper circuit might be a gate function circuit to pass only those signals that are of interest based on some a priori determined criteria.

Figure 2:
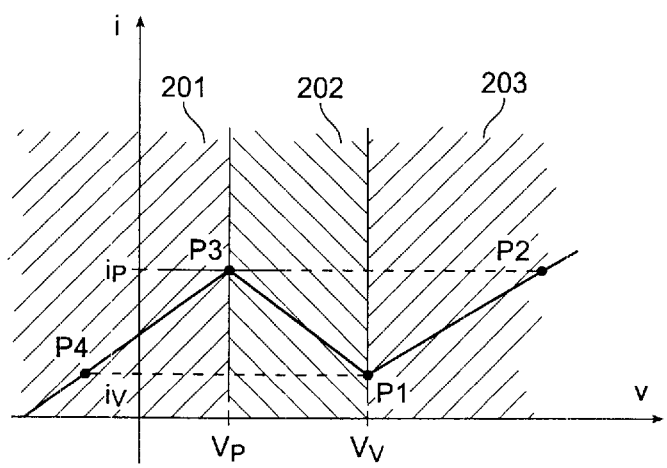
FIG. 2 illustrates a typical transfer curve which characterizes the circuitry of the present invention.

The conditioned signal 111 from the wave shaper circuit 102 is then fed to a nonlinear circuit combination 105, comprising an inductor 103 connected to a circuit 104. The circuit has an N-shaped I-V characteristic as shown in FIG. 2. As will be discussed, this characteristic curve can be dynamically translated by the optional input 108 for an op-amp based circuit configuration.

The output 113 from the circuit 104 comprises groups of pulses or periods of silence depending on the received signals. A pulse processing circuit 106 then determines the appropriate decoded digital signal 107 based on the received groups of pulses. The pulse processing circuit uses a timing circuit to determine a suitable timing window. The timing in effect applies a gating function to the detector output signals. Only pulses that are located within the gate function will be considered. As will be seen below in particular illustrative embodiments of the invention, the gating function comprises windows which are temporally aligned with the information waveform at the transmitting end of a communication system.

The gating function serves to mask out those pulses which do not correspond to the pulses in the original information waveform, while leaving the remaining groups of pulses which correspond to the information waveform intact. By detecting the number of pulses in each group, or even simply checking for the presence of pulses, we can reproduce the symbols represented by the information waveform.

The characteristic curve of the circuit 104 shown in FIG. 2 has two impasse points $P1=(V_v, i_v)$ and $P3=(V_p, i_p)$. Here, $i_v$ and $i_p$ represent the valley and the peak current of the N curve. In general, we do not require that the curves be piecewise linear. The only requirement is that the circuit have a characteristic curve which comprises at least three distinct regions: a middle region 202 having a negative impedance slope, while the two external regions 201, 203 are positive impedance slopes.

When the input signal 111 feeding into the circuit combination 105 forces the operating point to lie on the line segment P1–P3 of the characteristic curve, pulses will be generated at the output 113. The number of pulses produced depends on the available time; i.e., the duration that the input signal forces the operating point to lie on the line segment P1–P3.

Figure 3A:
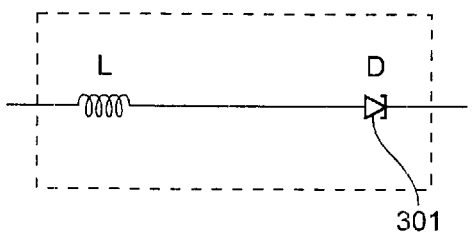
FIGS. 3A and 3B show a tunnel diode circuit and its I-V characteristic curve.
Figure 3B:
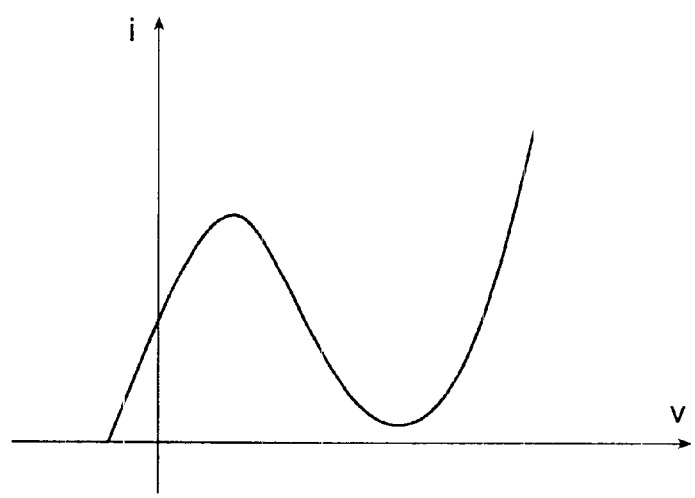

Referring to FIGS. 3A and 3B, in an illustrative embodiment of the invention, the circuit 104 used in the nonlinear circuit 105 shown in FIG. 1 might be a suitably chosen tunnel diode 301, as shown in FIG. 3A. The tunnel diode has the generally N-shaped characteristic curve shown in the FIG. 3B. Though the circuit configuration shown in FIG. 3A works well, the I-V characteristics of the tunnel diode are fixed and cannot be modified to suit the optimum performance for any particular given application of the nonlinear circuit 105. Moreover, the negative resistive region of the tunnel diode characteristic is usually not well controlled in the manufacturing process of the device, and thus is subject to change with temperature.

Figure 4:
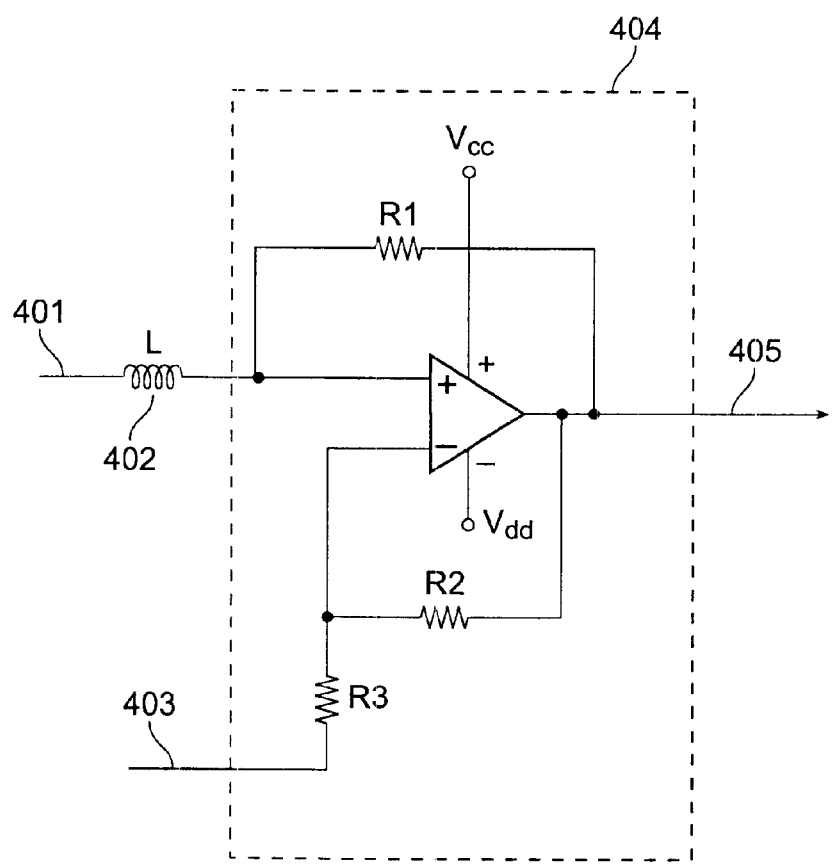
FIG. 4 illustrates an embodiment of a circuit according to the invention.

Referring now to FIG. 4, we show another circuit configuration that is based on an op-amp design. The circuit also has an N-shaped I-V characteristic, as with the tunnel diode but, as we shall see, the op-amp design has greater flexibility.

In this illustrative embodiment of the invention, the nonlinear circuit 104 of the nonlinear circuit combination 105 shown in FIG. 1 comprises the circuit 404 shown in FIG. 4. The circuit 404 is an op-amp based circuit which has the similar piecewise linear I-V characteristics as shown in FIG. 2. However, unlike the tunnel diode embodiment of FIG. 3A, the op-amp configuration permits the slopes of the characteristic curves and the impasse points to be adjusted quite easily; i.e., simply by changing the values of R1, R2, R3 and the biasing voltages Vcc and Vdd. In a particular illustrative embodiment, the component values are: R1=1000 Ω, R2=47 Ω, and R3=100 Ω. Vcc is set to 5V and Vdd is set to 0V. An example of an op-amp might be an EL2186 op-amp. The inductor is L=0.5 uH. The inductor L along with the tunnel diode or circuit with N-Shape I-V characteristic forms the controlled astable circuit.

The circuit of FIG. 4 is configured to respond to positive amplitude portions of an input waveform, by producing oscillatory output. More specifically, when the amplitude of the input waveform falls between $V_p$=0V and $V_v$=3V the operating point of the circuit is forced into the unstable region of its transfer curve. Consequently, the circuit's output will be oscillatory.

In addition, an optional control input 403 is shown in the diagram. In one case, we may simply ground this input to obtain a typical static N-shaped characteristic curve. For a more complex application, we may detect the operating environment noise to determine a suitable voltage to be applied to this optional input 403. The voltage at optional input 403 affects the circuit 404 in a way that the N-shaped characteristic curve is translated to a different location for optimum operation. Depending on the application, the voltage applied to optional input 403 can be a DC level, or a time varying signal. The translation of the characteristic curve is dynamic to the extent that the applied input voltage is time-varying.

Figure 5:
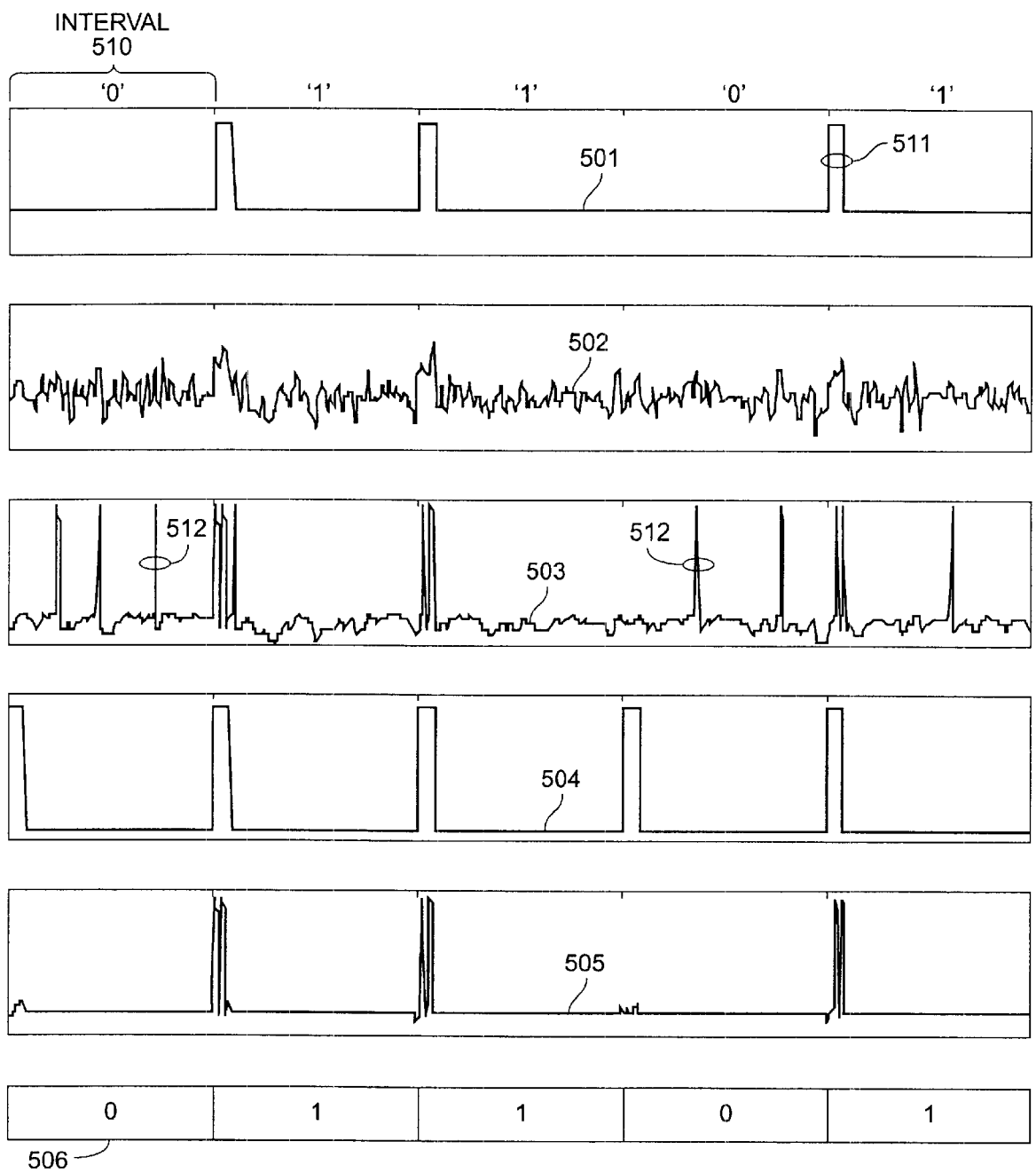
FIG. 5 shows the waveforms of the transmission and detection process based on ON-OFF keying modulation according to the invention.

With reference to FIG. 5, consider now the case of a transmission based on a conventional modulation technique known as ON-OFF keying scheme. In the ON-OFF keying scheme, a pulse is generated to represent a binary one and no pulse is present in the signal to represent a binary zero, or vice versa depending on the signaling convention being used. Pulse widths characteristic of UWB signaling (for most of the encoding schemes) are very short in duration. Pulse widths are typically in the range of tens of picoseconds to a few nanoseconds. The resulting transmission occupies a wide bandwidth from DC up to a few GHz depending on the pulse width used. In a typical transmission, it is common to apply a time hopping technique based on a pseudo-random code to the signal so that the spectrum of the transmitted signal appears as noise. In accordance with the ON-OFF keying scheme, a "1" bit or a "0" bit is represented by the presence or absence of a pulse at a particular location within the symbol transmission interval 510.

FIG. 5 shows the waveforms of an illustrative transmission scenario, including responses of the receiver shown in FIG. 1. An information waveform 501 represents the digital signal information to be transmitted. In this illustrative example, the signal that is being transmitted is 01101.

A typical transmission channel introduces noise to the transmitted signal, for example additive white Gaussian noise. This will corrupt the signal 501 and will produce a distorted received signal which is received at the UWB RF input 101 of the receiver circuit in FIG. 1. The level of noise distortion will affect the bit error rate (BER) of the system.

The received signal with its distortions is represented in FIG. 5 by the received waveform 502. Without loss of generality, it can be assumed that the receiver circuit does not use a wave shaper circuit 102 in this example. The received waveform 502, therefore, feeds directly to the nonlinear circuit 104 through the inductor 103.

The output 113 of the nonlinear circuit 104 comprises a series of pulses in response to application of the received signal 502. The output signal 113 is represented in FIG. 5 by the received pulse waveform 503. Depending on the tuning of the nonlinear circuit 104 (e.g., FIG. 4), each ON pulse 511 from the information waveform 501 will have a corresponding group of one or more pulses in the received pulse waveform 503. In this illustrative example, the components of the nonlinear circuit are tuned to produce two pulses per ON pulse. However, as can be seen in the received waveform 502, the received signal is corrupted by the channel noise, and so the received pulse waveform 503 is likely to contain extraneous pulses 512 as well.

The pulse processing circuit 106 is configured to produce a sequence of pulse windows synchronized with the data rate of the information waveform 501. These windows determine the intervals (frames) that are of interest, namely, those intervals where ON-OFF pulses representative of the information are expected to be located. These synchronized windows are shown in FIG. 5 as the pulse detection waveform 504. The pulse detection waveform acts as a gating signal to gate the received pulse waveform 503, allowing only those pulses that are at the information-containing locations to pass. The pulses comprising the pulse detection waveform are spaced apart accordingly so as to be synchronized with the timing scheme of the particular encoding technique used to produce the information waveform 501, in this case the ON-OFF keying modulation technique. The resulting gated signals, shown in FIG. 5 as the waveform 505, comprise those groups of pulses which correspond to the pulses contained in the information waveform 501.

In one embodiment of the invention, the pulse processing circuit 106 is configured to count the pulses in the gated signal 505. In this illustrative example, the a priori encoding scheme is used where two pulses are observed in the waveform 505 whenever there is a binary digit "1" and a silent period when the transmitted signal is a binary "0". Thus, the pulse processing circuit produces the information 506 ("01101") from the waveform 505. The information contained in the information signal 501 is thereby recovered from the signal 505.

Thus, we can see that the effects of the channel noise on the information signal are significantly reduced by the combined action of the nonlinear circuit 105 and the production of the gated signal 505.

Figure 6:
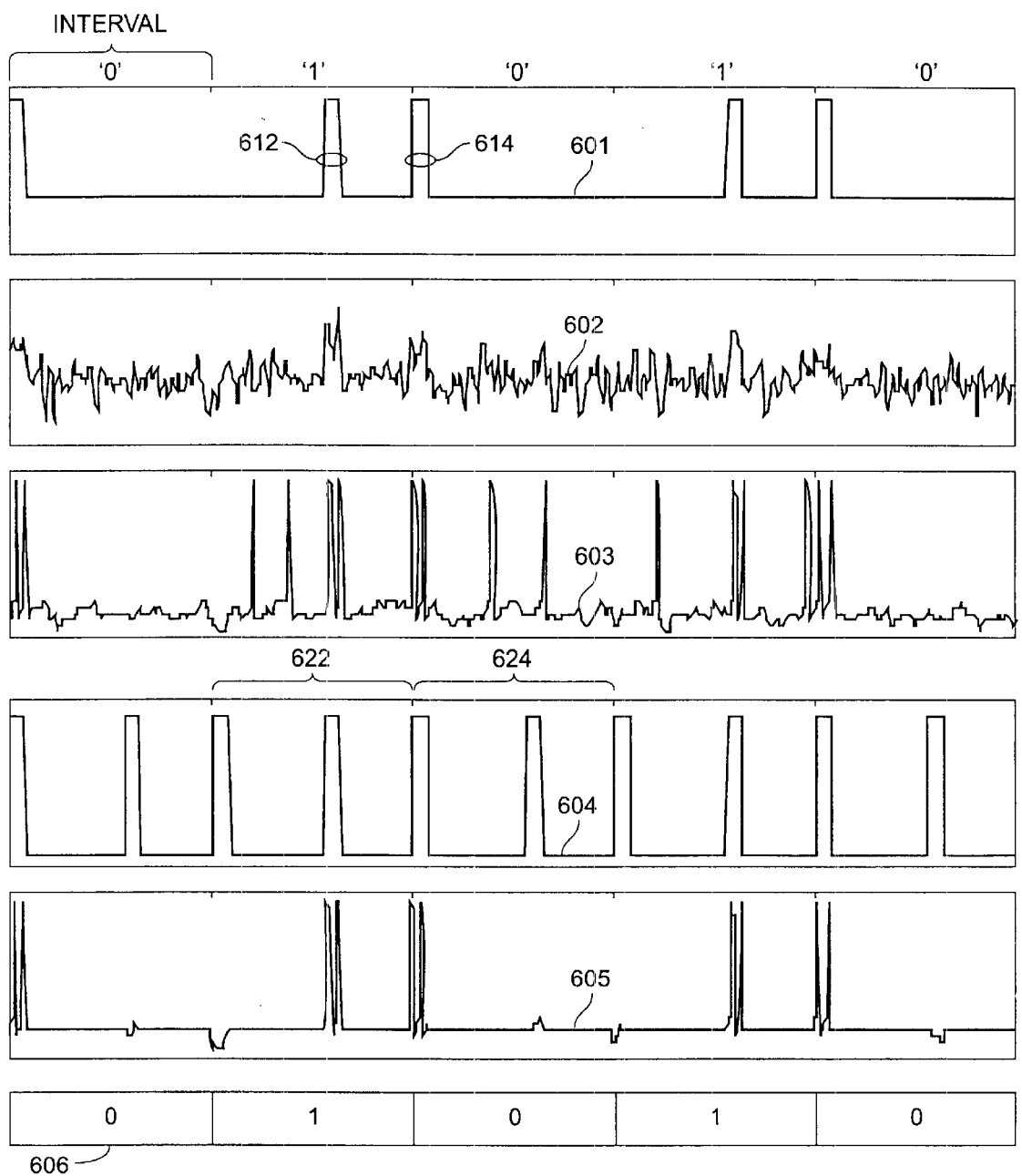
FIG. 6 shows waveforms of the transmission and detection process based on a pulse position modulation scheme using the circuit of FIG. 4.

FIG. 6 demonstrates another illustrative embodiment using the present invention. This example uses another conventional UWB modulation scheme known as the Pulse Position Modulation (PPM) arrangement comprising circuitry in accordance with the teachings of the present invention. To simplify the discussion, we will explain the modulation technique using a binary modulation configuration. From the discussion which follows, it will be understood that a general M-ary signaling configuration is readily attained, being a simple extension of the binary approach.

In this pulse position modulation embodiment, we position the pulses at different locations with respect to the start of each transmission interval to represent either a binary "0" or a binary "1". In this particular binary configuration, where each transmission interval or frame period contains one of the two symbols, we might encode a "0" bit by placing a pulse at the start of each transmission bit (symbol) interval or frame period and a "1" bit might be represented by the presence of a pulse near the middle of the transmission interval or frame period. In a general M-ary scheme, m positions would be defined in the transmission interval, one position for each of the m symbols.

FIG. 6 shows the relevant waveforms for this transmission approach, including a typical response of the receiver shown in FIG. 1. An information waveform 601 represents the digital signal to be transmitted. In this illustrative example, the signal that is being transmitted is 01010. Thus, for example, the waveform 601 shows the transmission intervals (or frame periods). The pulse position 612 within the second interval (or frame) represents a "1" bit and the pulse at the position 614 within the third interval represents a "0" bit, and so on.

Due to the additive white Gaussian noise present in the channel, the transmitted signal that is received is corrupted. The distorted received signal is illustrated by the received waveform 602. As with FIG. 5, to simplify the explanation without loss of generality it can be assumed that there is no wave shaper 102 (FIG. 1) in this example. The received waveform 602, therefore, feeds directly into the nonlinear circuit 105.

The output 113 from the nonlinear circuit 105 comprises groups of pulses that are produced in response to the amplitudes of the received waveform 602, including the level of the added noise. Depending on the tuning of the components comprising the circuit 104, the digital signal contained in the received waveform 602 will produce a specific number of pulses for each transmitted bit in the information waveform 601. Here, it can be seen that the nonlinear circuit 104 is configured to produce two pulses, as evidenced by the waveform 603 representing the output signal 113. However, the waveform 603 also includes pulses produced by the artifacts in the received waveform 602, due to the distorting effects of the channel.

The output signal 113 feeds into the pulse processing circuit 106 to recover digital signal waveform 601. In this particular illustrative embodiment of the invention, a pulse detection waveform 604 comprising a sequence of synchronized windows 622, 624 is generated by the pulse processing circuit. These windows serve to gate the pulses contained in the waveform 603 and are synchronized to the timing of the encoding scheme used to produce the information waveform 601. The pulse detection waveform eliminates the non-information pulses, leaving those groups of pulses corresponding to the pulses contained in the information waveform 601. The resulting waveform is shown in FIG. 6 as a gated signal waveform 605.

Based on the groups of pulses contained in the waveform 605, the pulse processing circuit 106 produces the information 606 ("01010"), which represents information recovered from waveform 601. The reproduced waveform 605 is absent of errors despite the detrimental effects of the channel noise added to the transmitted signal. The nonlinear circuit 105 is optimized in such a way that it is least responsive towards noise and most responsive to the transmitted signal which are both present in the received signal 602 to produce spikes 603. Subsequent masking of spikes by the pulse detection waveform 604 produces the substantially error-free waveform 605.

Figure 7:
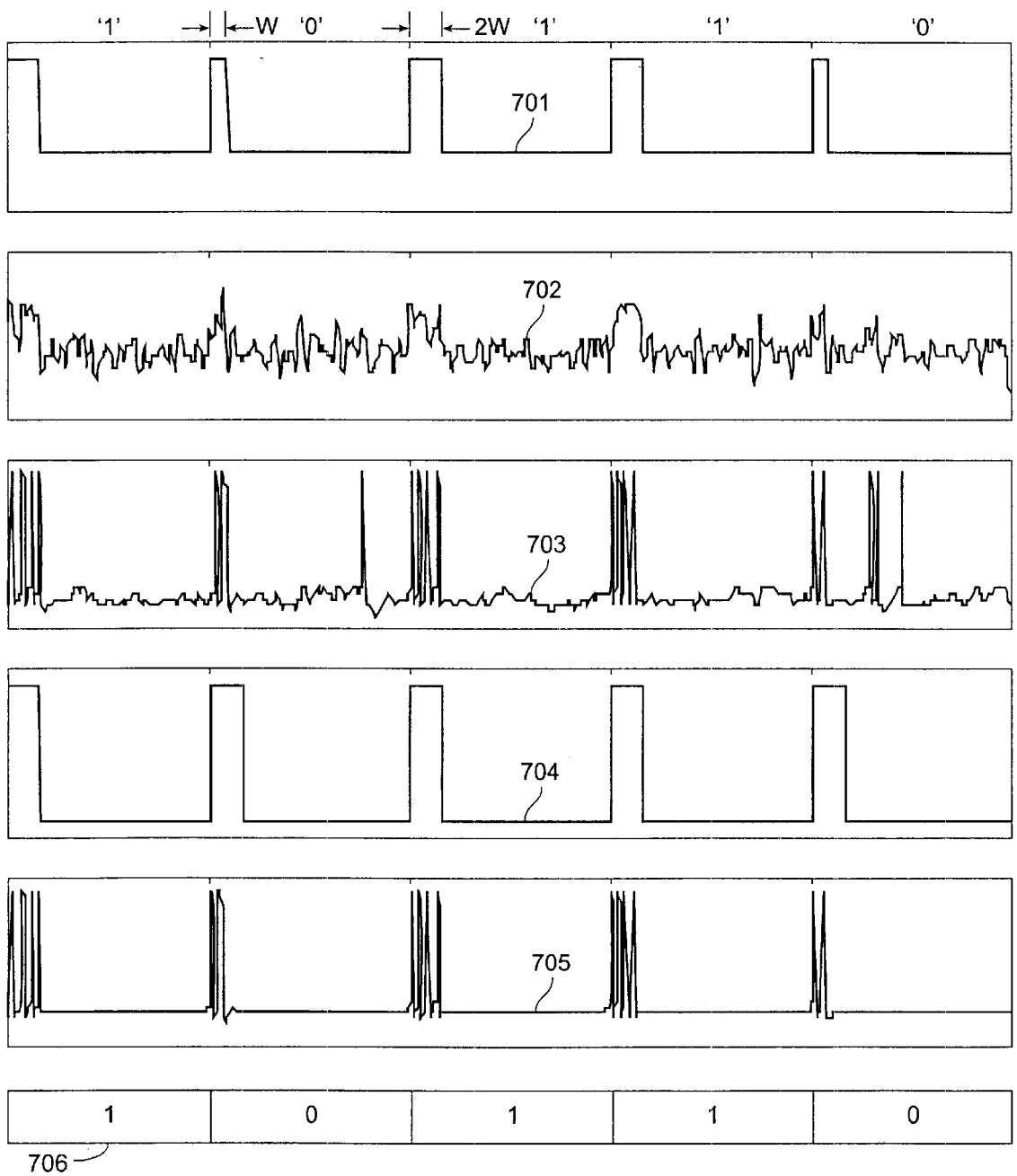
FIG. 7 illustrates another set of waveforms of the transmission and detection process based on a Pulse Width Modulation scheme according to the invention.

Referring now to FIG. 7, yet another illustrative embodiment of the invention is discussed. This particular example demonstrates the transmission of waveforms produced by a UWB modulation scheme known as pulse width modulation. In a Pulse Width Modulation (PWM) scheme, we use the width duration of a pulse to represent a bit "0" and a bit "1". In the following illustration, we encode a bit "0" as a pulse at the start of each transmission bit interval having a pulse width of one unit of duration (W), and a bit "1" as a pulse having an interval of two units of duration (2W).

FIG. 7 illustrates the waveforms for this transmission scenario. The information waveform 701 represents the digital signal that has been transmitted. In this illustrative example, the signal that is being transmitted is 10110. Due to the additive white Gaussian noise presence in the channel, this transmitted signal is corrupted when received and is shown as the waveform 702. For ease of explanation, we assume that there is no wave shaper (102, FIG. 1) in this example. The output 113 from the nonlinear circuit 104 comprises a series of pulses depending on signals corresponding to the pulses in waveform 701, in addition to the artifact signals produced as a result of the channel-induced noise and distortions. The output 113 is shown as the waveform 703 in FIG. 7.

Upon receiving this signal, the pulse processing circuit 106 will determine the decoded digital signals. In this particular pulse width modulation scheme, a sequence of synchronized windows is generated by the pulse processing circuit. The sequence of synchronized windows is shown in FIG. 7 as the pulse detection waveform 704. As in the examples discussed in FIGS. 5 and 6, the windows are synchronized to the timing of the encoding scheme used to encode the symbols represented by the information waveform 701. In the case of pulse width modulation, each window is a pulse having the maximum width, which for the particular illustrative example shown in FIG. 7 is a width of 2W. The pulse detection waveform 704 is combined with the waveform 703 to produce a gated signal, shown in FIG. 7 as the waveform 705.

Depending on the tuning of the nonlinear circuit 104, the presence of a digital signal (see waveform 701) can generate a specified number of pulses. In this illustrative example, two pulses are generated when a bit "0" is being sent and four pulses are generated when a bit "1" is being sent. By counting the number of pulses in each of the groups of pulses contained in the waveform 705, the pulse processing circuit can easily determine the decoded signal to be "10110".

Thus, as in FIGS. 5 and 6, one symbol can be recovered from each frame. This aspect of the present invention represents an improvement over existing systems. For example, correlation-based UWB system typically requires hundreds to thousands of frames to produce a symbol. Moreover, the present invention system configuration is much simpler.

Figure 8:
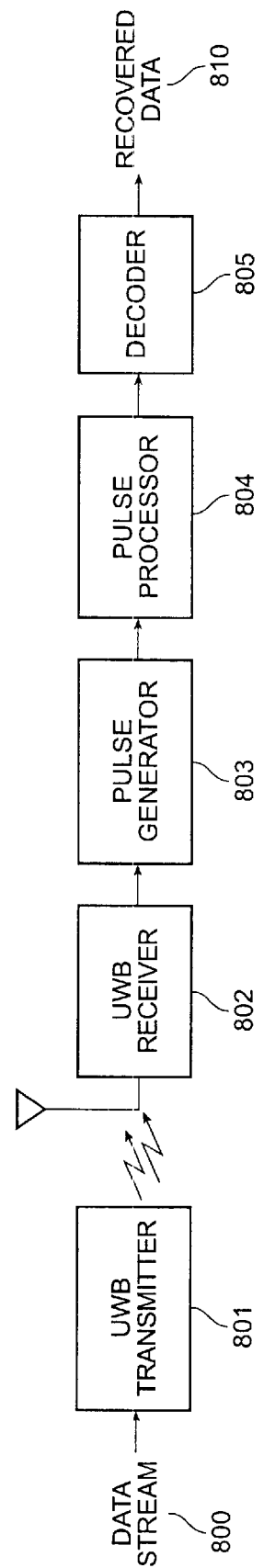
FIG. 8 shows an illustrative embodiment of the present invention as used in a communication system.

FIG. 8 shows another illustrative embodiment of the present invention, wherein a UWB-based communication system incorporates the foregoing disclosed receiver configurations. The communication system includes a UWB transmitter 801 which receives a plurality of data symbols 800 intended for transmission. The UWB transmitter encodes the data symbols in accordance with a pulse modulation scheme to produce a signal that is suitable for transmission. Examples of modulation techniques include the foregoing disclosed techniques of ON-OFF keying, pulse position modulation, and pulse width modulation. These and other techniques are readily adaptable for use in the present invention.

The UWB transmission is received by a UWB receiver 802. A received signal produced by the UWB receiver is fed into a pulse generation circuit 803, such as the nonlinear circuit 104 generally described in FIG. 1 and more specifically disclosed in FIGS. 3A and 4. Pulse processing 804 is performed as described above to produce groups of one or more pulses representative of the data stream 800. A decoder 805 produces the recovered data symbols based on the groups of pulses received from the pulse processor 804.

A particular embodiment of a UWB-based communication system is a UWB impulse radar system. Referring again to FIG. 8, the UWB transmitter 801 might be a conventional impulse radar transmission subsystem. A UWB pulse containing identifying data is transmitted toward a target. The UWB pulse bounces off the target and is detected by the receiver 802 as a reflected signal. The reflected signal is processed by the pulse generator 803, the pulse processor 804, and the decoder 805 as disclosed herein to recover the identifying data. The identifying data is correlated with the target, so that multiple targets can be tracked by assigning each with unique data.

This invention has been explained with reference to specific illustrative embodiments. Various circuits for generating pulses from analog waveforms have been presented. Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Although the present invention has been described in terms of specific embodiments, it should be apparent to those skilled in the art that the scope of the present invention is not limited to the described specific embodiments.

Further, while the present invention has been described using a particular combination of hardware and software, it should be recognized that other combinations of hardware and software are also within the scope of the present invention. The present invention may be implemented only in hardware or only in software or using combinations thereof, depending on performance goals and other criteria not relevant to the invention.

The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for detecting an ultra-wide band (UWB) signal comprising:
   receiving a transmitted UWB signal as a received signal;
   providing a circuit configured to produce a plurality of groups of one or more pulses in response to sensing portions of said received signal;
   detecting a subset of said groups of one or more pulses; and
   producing an information symbol for each group of one or more pulses contained in said subset.

2. The method of claim 1 wherein said circuit is configured to produce said groups of one or more pulses upon detecting amplitudes in said received signal which exceed a first value.

3. The method of claim 1 wherein said producing includes counting pulses in said each group of one or more pulses to produce a count and associating said count to an information symbol.

4. The method of claim 1 wherein said transmitted UWB signal is a pulse encoded signal comprising a plurality of pulses, said groups of one or more pulses in said subset corresponding to said pulses.

5. The method of claim 4 wherein said detecting includes producing a pulse detection waveform comprising pulse windows synchronized with said pulse encoded signal and masking out some of said groups of one or more pulses using said pulse detection waveform.

6. The method of claim 4 wherein said pulse encoded signal is representative of an information waveform produced using an ON-OFF keying technique.

7. The method of claim 4 wherein said pulse encoded signal representative of an information waveform produced using a pulse position modulation technique.

8. The method of claim 4 wherein said pulse encoded signal representative of an information waveform produced using a pulse width modulation technique.

9. A method for recovering information from an ultra-wide band (UWB) signal comprising:
   receiving a transmission of said UWB signal as a received signal;
   producing a plurality of groups of one or more pulses from said received signal; and
   decoding at least some of said groups of one or more pulses to produce a plurality of symbols, said information comprising said symbols.

10. The method of claim 9 wherein said producing includes applying said received signal to a circuit characterized by a transfer function having an unstable operating region bounded by a first stable operating region and a second stable operating region.

11. The method of claim 10 wherein said circuit is responsive to an amplitude of said received signal, said circuit producing a group of one or more pulses when said amplitude exceeds a first value.

12. The method of claim 9 wherein said decoding includes eliminating one or more of said groups of one or more pulses to produce remaining groups of one or more pulses, said decoding being performed on said remaining groups of one or more pulses.

13. The method of claim 12 wherein said eliminating includes producing a pulse detection waveform comprising a plurality of pulses synchronized with the pulse timing of an information waveform produced in accordance with a pulse encoding technique, said UWB signal being produced from said information waveform, said information waveform representative of said symbols.

14. The method of claim 13 wherein pulse encoding technique is an ON-OFF keying technique.

15. The method of claim 13 wherein said pulse encoding technique is a binary or M-ary pulse width modulation technique.

16. The method of claim 13 wherein said pulse encoding technique is a pulse position modulation technique.

17. The method of claim 16 wherein pulse position modulation technique is an M-ary modulation scheme.

18. The method of claim 16 wherein pulse position modulation technique is a binary modulation scheme.

19. The method of claim 9 wherein said decoding includes producing pulse counts for each group in said groups of one or more pulses.

20. A circuit system for detecting an ultra-wide band (UWB) signal comprising:
    a receiver circuit configured to receive a transmitted UWB signal as a received signal;
    a pulse generation circuit configured to produce a plurality of groups of one or more pulses in response to detecting said received signal; and
    a detector circuit configured to detect some of said groups of one or more pulses and in response thereto producing a plurality of information symbols.

21. The circuit system of claim 20 wherein said pulse generation circuit has an associated transfer curve characterized by having an unstable region bounded by first and second unstable regions.

22. The circuit system of claim 21 wherein said pulse generation circuit includes an input for receiving a control signal, said pulse generation circuit further configured so that said associated transfer curve is translated in response to said control signal.

23. The circuit system of claim 20 wherein said UWB signal is a pulse encoded signal comprising plural pulses, said pulse encoded signal representative of said information symbols, said pulse encoded signal produced by applying an ON-OFF keying technique to said information symbols.

24. The circuit system of claim 20 wherein said UWB signal is a pulse encoded signal comprising plural pulses, said pulse encoded signal representative of said information symbols, said pulse encoded signal produced by applying a pulse position modulation technique to said information symbols.

25. The circuit system of claim 20 wherein said UWB signal is a pulse encoded signal comprising plural pulses, said pulse encoded signal representative of said information symbols, said pulse encoded signal produced by applying a pulse width modulation technique to said information symbols.

26. An ultra-wide band (UWB) detection system comprising:
    means for receiving a transmitted UWB signal as a received signal;
    means for producing a plurality of pulses from said received signal;
    means for masking out some of said pulses to produce remaining pulses; and
    means for producing information symbols from said remaining pulses.

27. The detection system of claim 26 wherein said means for producing a plurality of pulses includes a circuit having a transfer function characterized by having an unstable operating region bounded by first and second stable operating regions.

28. The detection system of claim 26 wherein said means for masking includes means for generating a pulse detection waveform, wherein some of said pulses are masked based on said pulse detection waveform.

29. The detection system of claim 26 wherein said UWB signal is based on an information waveform produced in accordance with a pulse encoding scheme, said pulse detection waveform comprising pulses synchronized with pulses produced by said pulse encoding scheme.

30. The detection system of claim 29 wherein said pulse encoding scheme is ON-OFF keying.

31. The detection system of claim 29 wherein said pulse encoding scheme is a pulse position modulation technique.

32. The detection system of claim 29 wherein said pulse encoding scheme is a pulse width modulation technique.

33. In an impulse radar system, a UWB detector comprising:
    means for receiving a reflected UWB radar signal as a received signal;
    means for producing a plurality of pulses from said received signal;
    means for masking out some of said pulses to produce remaining pulses; and
    means for producing information symbols from said remaining pulses.

* * * * *